United States Patent [19]

Hansen et al.

[11] Patent Number: 4,837,581
[45] Date of Patent: Jun. 6, 1989

[54] DEVICE FOR THE EMI TESTING OF ELECTRONIC SYSTEMS

[75] Inventors: Diethard Hansen, Berikon; Dietrich Königstein, Dättwil, both of Switzerland

[73] Assignee: BBC Brown Boveri AG, Baden, Switzerland

[21] Appl. No.: 48,647

[22] Filed: May 11, 1987

[30] Foreign Application Priority Data

May 20, 1986 [CH] Switzerland ............... 2026/86

[51] Int. Cl.$^4$ .................. H01Q 17/00; G01R 31/00
[52] U.S. Cl. ................................................ 343/703
[58] Field of Search .............. 343/703; 174/35 MS

[56] References Cited

U.S. PATENT DOCUMENTS 3,806,943 4/1974 Holloway ..................... 343/703
4,546,358 10/1985 Edlin et al. ................. 343/703

FOREIGN PATENT DOCUMENTS 1276764 9/1968 Fed. Rep. of Germany .
2159667 12/1985 United Kingdom .

OTHER PUBLICATIONS

The Exciting Mechanism of the Parallel Plate EMP Simulator, Shen et al., IEEE Transactions on Electromagnetic Compatability, vol. EMC-29, No. 1, Feb. 1987.
IEEE Transaction on Instrumentation & Measurement, M. L. Crawford et al., Sep., 1977, vol. IM-26, No. 3, pp. 225–230.
"Antenna Measurements–1978", W. Kummer, et al., Proceedings of the IEEE, vol. 66, No. 4, Apr. 1978, pp. 483–507.
Der NEMP-Modell-Simulator des INT Euskirchen, H. U. Schmidt, Jan. 1985.
A Review of Electromagnetic Compatibility/Interference Measurement Methodologies, M. T. Ma, et al., Proceedings of the IEEE, Mar. 1985, No. 3.

*Primary Examiner*—William L. Sikes
*Assistant Examiner*—Doris J. Johnson
*Attorney, Agent, or Firm*—Oblon, Spivak, McClelland, Maier & Neustadt

[57] ABSTRACT

The device according to the invention exhibits a TEM waveguide (1), which opens out in a pyramid shape and which is closed by a wall (7) of high-frequency peak absorbers (7.1) and which exhibits an asymmetrically disposed, plate-shaped inner line (6), which is connected to a plurality of terminal resistors (8.1, 8.2, 8.3) through the absorber wall (7). The TEM waveguide (1) further exhibits a closed outer line (5). The absorber wall (7) is curved in the manner of a spherical segment, the center of curvature being situated in the region of the tip (2) of the pyramid-shaped TEM waveguide (1).

9 Claims, 1 Drawing Sheet

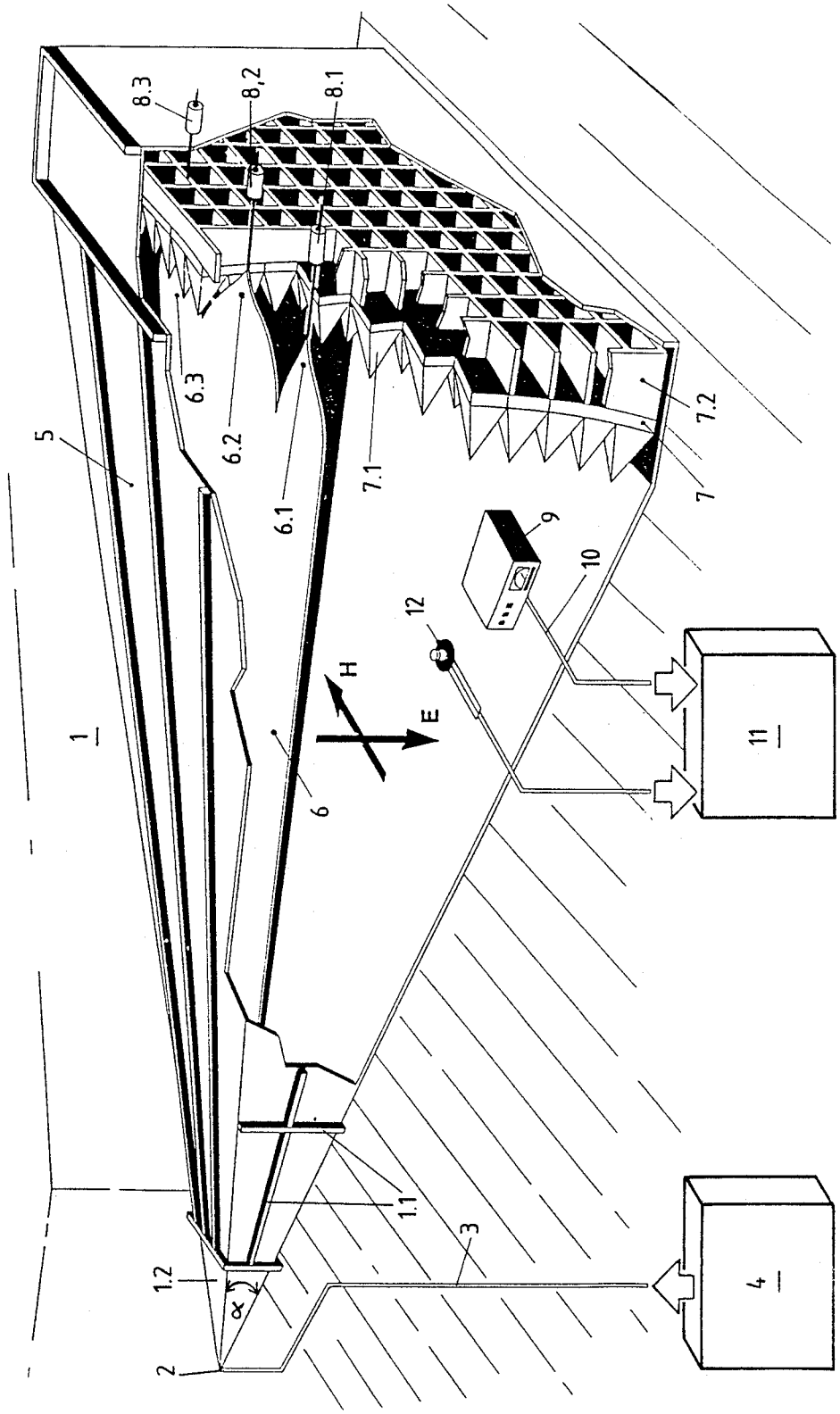

DEVICE FOR THE EMI TESTING OF ELECTRONIC SYSTEMS

FIELD OF THE INVENTION

The present invention relates to a device for the EMI testing of electronic systems. "EMI" appears as an abbreviation for "electromagnetic interference". The invention relates, in particular, to such a device having a TEM waveguide, which opens out in a pyramid shape and which is closed by a wall of high-frequency peak absorbers and which exhibits an asymmetrically disposed, plate-shaped inner line, which is connected through the absorber wall to a number of terminal resistors.

DESCRIPTION OF THE PRIOR ART

A device of the abovementioned type has been constructed in the Institut für naturwissenschaftlich-technische-Analysen (Institute for Natural Science and Engineering Analyses) of the Frauenhofer Gesellschaft in Euskirchen, Federal Republic of Germany. The TEM waveguide of this device is laterally open. It consists of an asymmetric three-strip line arrangement.

For reasons associated with the emission of radiation, it can be operated only in a screened room. In it, the wall constructed of the high-frequency peak absorbers is situated in the line cross-section and is planar. The inner line is suspended by nylon threads at the upper strip line. In the region of passage through the absorber wall, the inner line tapers towards the terminal resistors. By this means, a compensation of the capacitive loading caused by the absorbers is achieved in relation to the characteristic impedance. So-called light-structure aluminum plates are employed in accordance with the sandwich principle as material for the inner line. The TEM waveguide of the device of the Frauenhofer Gessellschaft cannot be dismantled in the longitudinal direction. The return loss achieved with this waveguide is better than −15 dB up to a frequency of approximately 2.5 GHz.

DESCRIPTION OF THE INVENTION

An object of the present invention is to provide a device of the initially mentioned type which, above all, is improved with regard to its external space requirement in relation to the useful test volume. The test volume should be able to accommodate at least one individual, relatively small switch cabinet of the size customarily used nowadays.

A further object of the present invention is to provide a device of the initially mentioned type which is improved with respect to its wave transmission properties.

The said objects as well as other objects are achieved according to the present invention by the provision of a novel device for the EMI testing of electronic systems having a TEM waveguide, which opens out in a pyramid shape and which is closed by a wall of high-frequency peak absorbers and which exhibits an asymmetrically disposed, plate-shaped inner line, which is connected through the absorber wall to a number of terminal resistors; the TEM waveguide further exhibits a closed outer line, and the absorber wall is curved in the manner of a spherical segment, the center of curvature being situated in the region of the tip of the pyramid-shaped TEM waveguide.

As a result of the closed outer line of the TEM waveguide, the device according to the invention is practically free from extraneous emission of radiation to the environment. Accordingly, it does not need to be operated in a screened area, but can be set up directly at any selectable location, without restriction. Accordingly, it is the external dimensions of the TEM waveguide and not those of a screened area which determine the space requirement of the device. With the device according to the invention, the ratio of space requirement to useful test space volume is optimized to a very great extent.

As a result of the design of the absorber wall in the manner of a spherical segment, differing transit paths and transit times for the electromagnetic waves are avoided in the TEM waveguide. Resonance problems which are per se to be expected in a TEM waveguide with a closed outer line of the size under consideration here do not occur. In addition to this, an excellent field homogeneity in the test value over the entire frequency range is achieved. The same applies to the return loss.

Even more far-reaching improvements can be achieved by means of the measures defined in the appended patent claims.

Thus, it is of advantage to divide the inner line into a plurality of partial lines in the region of passage through the absorber wall, in which its width must be reduced in order to compensate the capacitive effect of the absorbers on the characteristic impedance, and in each instance to taper the width of the partial lines towards the terminal resistors. By this means, transverse components of the field in the terminal region, which cause field distortions and reflections, are reduced to a very small amount. With a device according to the invention which is designed in this manner and which has a length of 6.5 m, an overall height of 1.5 m and a width of 3 m, it was possible to achieve a return loss of better than −20 dB over a frequency range of 0 hz to approximately 2.5 GHz. A value of better than 10 dB could be determined in the said frequency range for the homogeneity (fluctuation width) of the electromagnetic field.

By means of a design of the TEM waveguide with a removable feed wedge which is gas-tight on all sides and which is capable of withstanding excess pressure and which can be filled with $SF_6$ gas, the device according to the invention can also be designed so as to be suitable for extremely high field strengths. In addition, high-tension resistors can be employed as terminal resistors for this purpose.

BRIEF DESCRIPTION OF THE DRAWING

Further features and advantages of the present invention are evident from the detailed description which follows, in particular with reference to the accompanying DRAWING. The DRAWING shows, in a single figure, a perspective view of a device according to the invention having a TEM waveguide which opens out in a pyramid shape.

BEST MANNER OF IMPLEMENTATION OF THE INVENTION

Reference is now made to the drawing. In the drawing, reference numeral 1 designates a TEM waveguide. "TEM" appears as an abbreviation for "transverse electromagnetic". The TEM waveguide 1 opens out in a pyramid shape from its tip 2. It does not exhibit any kinks. Although this is not discernible in the drawing, at its tip 2 a coaxial feed bushing is provided, via which a pulse or sinusoidal generator 4 can be connected to the TEM waveguide 1 by means of a coaxial cable 3.

The TEM waveguide exhibits a closed outer line 5 having a rectangular cross-section. A plate-shaped inner line 6 of triangular shape is suspended in its interior asymmetrically on nylon threads. "Asymmetrically" means that the inner line 6 exhibits a smaller spacing from the top of the outer line 5 than from the bottom thereof. As a result of this asymmetry, there is in the lower part of the TEM waveguide 1 a greater useful test volume than if the inner line 6 were disposed symmetrically. This arrangement also results in a smaller reaction of the electrical systems to be tested on the electromagnetic field. Preferably, the spacing of the inner line 6 from the top of the outer line 5 amounts to one quarter of its respective height. Correspondingly, the spacing of the inner line 5 from the bottom or baseplate of the outer line 5 amounts to three quarters of its respective height.

Having regard to the asymmetric arrangement of the inner line 6 and the outer line 5, the widths of these are selected in their ratio to one another in such a manner that a characteristic impedance corresponding to the pulse generator or to the sinusoidal generator 4 and naturally also to the coaxial cable 3 is created for the TEM waveguide 1. At an aperture angle of 20° and the preferred asymmetry of $\frac{1}{4}:\frac{3}{4}$, a characteristic impedance of 50 ohms is created, for example, by a width ratio of 0.636.

As has already been mentioned, the inner line 6 is suspended by means of nylon threads at the top of the outer line 5. A fine tuning of the characteristic impedance is possible by a slight variation of the length of these nylon threads and thereby also of the abovementioned assymmetry.

The TEM waveguide 1 is closed on the one hand by a plurality of mutually adjoining pyramid-shaped high-frequency peak absorbers 7.1 which in their entirety form an absorber wall 7, and on the other hand by three ohmic terminal resistors 8.1, 8.2 and 8.3. The high-frequency peak absorbers 7.1 and the terminal resistors 8.1, 8.2 and 8.3 are complementary in their closing effect. The latter form the effective termination of the TEM waveguide for frequencies below approximately 100-200 MHz. The high-frequency peak absorbers are designed, as regards their shape and size, in such a manner that they come into effect above 100-200 Mhz.

The absorber wall 7 is curved in the manner of a spherical segment. The center of curvature is situated in the region of the tip 2 of the TEM waveguide. As a result of this curvature, differing transit paths and transit times of the electromagnetic waves in the TEM waveguide 1 are avoided.

The peak absorbers 7.1 preferably consist of polyurethane foam, which is compounded with conductive particles, e.g. of carbon in the form of graphite or soot. In spite of this compounding with the conductive material, the absorbers 7.1 as a whole exhibit relatively poor conductivity. As a result of their finite conductivity and their pyramid shape, HF energy is converted into heat in them. Their peak height should amount to approximately $\frac{1}{3}$ of the height of the outer line 5 at its opened-out end, and the ratio of peak height to base surface area should amount to approximately 6.5:1. As shown in the drawing, the absorber wall 7 or the peak absorbers 7.1 can be supported by a box-like structure 7.2. The inner line 6 is connected to the terminal resistors 8.1, 8.2 and 8.3 by the absorber wall 7 - passing through between two rows of absorbers 7.1 - with splitting into three separate parallel partial lines 6.1, 6.2 and 6.3; in this connection, a terminal resistor is connected at each of the partial lines 6.1, 6.2 and 6.3. The terminal resistors 8.1, 8.2 and 8.3 connect the inner line or its partial lines 6.1, 6.2 and 6.3 to the outer line 5.

The position of separation of the inner line 6 into the partial lines 6.1, 6.2 and 6.3 is situated approximately at the height of the peaks of the absorbers 7.1. The splitting of the inner line 6 into the three partial lines 6.1, 6.2 and 6.3 is undertaken in such a manner that the same surface charge or the same partial characteristic impedance is allocated to each one of the three partial lines in the waveguide. The terminal resistors 8.1, 8.2 and 8.3 can then be dimensioned consistently, in a manner corresponding to this partial characteristic impedance. In this case, the central partial line 6.2 is at first wider than the two outer ones 6.1 and 6.3.

The three partial lines 6.1, 6.2 and 6.3 taper acutely towards the terminal resistors 8.1, 8.2 and 8.3. In this connection, the taper of their width is provided in each instance in such a manner that the capacitive covering which is caused by the absorbers 7.1 and which increases towards the terminal resistors in the absorber wall 7 as a result of their peaks or pyramid shape is compensated in its effect on the characteristic impedance or partial characteristic impedance.

The TEM waveguide 1 can be made in the form of a light construction. Light-weight aluminum plates supported by aluminum profiles 1.1 can be employed as material for the outer line in accordance with the sandwich principle. This material offers not only a low weight and a high degree of stiffness but also the advantage that it can be processed off the roll. The lateral parts of the outer line can thereby be constructed from a single piece, without butt joints. This is of advantage with regard to the avoidance of reflections. An aluminum sheet or a galvanized steel sheet can be employed as material for the inner line. Furthermore, the final third of the baseplate of the outer line 5 in front of the absorber wall 7, on which outer line the electronic systems to be tested such as the system 9 shown in the drawing as a rule stand, can be reinforced by a galvanized steel sheet.

In order to provide convenient access to the interior of the TEM waveguide 1, a door can be provided in one of the lateral walls of the outer line 5. This door is preferably a sliding door.

In addition to having good wave propagation properties, the TEM waveguide should also be sufficiently resistant to high voltages, in order to permit testing using NEMP field strengths of 50 kV/m. "NEMP" appears as an abbreviation for the so-called "nuclear electromagnetic pulse". With unchanged geometry, the resistance to high voltages of the TEM waveguide 1 can be increased substantially by filling the waveguide not with air but instead with an electronegative gas such as, for example, $SF_6$ at a pressure which is as high as possible. In the case of the preferred overall length of the TEM waveguide 1 of over 6 m and the preferred light construction, this is not, however, possible without further ado. It is, of itself, also not required, since flashovers or breakdowns are to be expected only in the region of the tip of the TEM waveguide 1, more precisely at the place of transition from the coaxial feed socket, which is as a rule filled with a solid insulator, to the gas-filled waveguide. It is therefore sufficient to design the tip region or the feed wedge of the TEM waveguide 1 in an appropriate manner. Preferably, the feed wedge of the TEM waveguide 1 is constructed as a separate component part 1.2, which is releasably secured to the remaining part of the TEM waveguide 1, closed in a gas-tight manner on all sides and capable of being subjected to excess pressure. The volume of the removable feed wedge 1.2 is sealed in relation to the remaining volume of the TEM waveguide 1 by means of a thin dielectric foil which alters the high-frequency properties to the smallest extent possible. The longitudinal extent of the feed wedge 1.2 need be only approximately 1.10 of the overall length of the TEM waveguide 1.

Having regard to the resistance of the TEM waveguide 1 to high voltages, it is possible, by way of a supplementary matter, to construct the terminal resistors as high-tension resistors. They should be designed for at least 100 kV. However, high-tension resistors are naturally long, and exhibit a considerable inductivity as a result of their overall length. This makes them unsuitable, of themselves, for use as high-frequency terminal resistors. High-frequency terminal resistors should be as short as possible and should exhibit low inductivity. In the case of resistors, good high tension properties and high frequency properties are mutually exclusive. In spite of this problem, high-tension resistors can be employed in the device according to the invention, because they are required and must be effective as terminal resistors only up to approximately 100–200 MHz. Above 200 MHz, as has been explained, the effective termination of the TEM waveguide 1 is formed by the high-frequency peak absorbers 7.1. In terms of power, the terminal resistors should be designed for a CW power of up to 1 kW.

From the electronic system, such as the system 9 in the drawing, which is introduced into the TEM waveguide 1 and which is to be tested, measurement lines 10 lead out of the TEM waveguide to appropriate measuring instruments 11. Field sensors 12 can also be connected to these, by means of which field sensors the strength of the electromagnetic field is measured in the TEM waveguide 1 in the vicinity of the electrical system 9 to be tested.

Instead of being used for testing the effect of electromagnetic fields on electronic systems, the device according to the invention can also be employed for measuring the radiation emitted by an electronic system.

We claim:

1. A device for the EMI testing of electronic systems having a TEM waveguide (1), which opens out in a pyramid shape and which is terminated by a wall (7) of high-frequency peak absorbers (7.1) and which exhibits an asymmetrically disposed, plate-shaped inner line (6), which is connected to a number of terminal resistors (8.1, 8.2, 8.3) through the absorber wall (7), wherein the TEM waveguide (1) exhibits a closed outer line (5), wherein the absorber wall (7) is curved in the manner of a spherical segment, and wherein the center of curvature is situated in the region of the tip (2) of the pyramid-shaped TEM waveguide (1).

2. The device as claimed in claim 1, wherein the inner line (6) is separated, in the region directly before passage through the absorber wall (7), into a plurality, preferably into three parallel partial lines (6.1, 6.2, 6.3), to which respective terminal resistors (8.1, 8.2, 8.3) are connected 3. The device as claimed in claim 2, wherein the inner line (6) is divided into the partial lines (6.1, 6.2, 6.3) dimensioned such that the same surface charge or the same partial characteristic impedance is allocated to each one of the partial lines in the course of wave propagation.

4. The device as claimed in claim 2, wherein equally large terminal resistors (8.1, 8.2, 8.3) are connected to the partial lines (6.1, 6.2, 6.3).

5. The device as claimed in claim 2, wherein the partial lines (6.1, 6.2, 6.3) taper acutely towards the terminal resistors (8.1, 8.2, 8.3), and wherein the taper of their width is dimensioned such that the capacitive covering, which increases in the absorber wall (7) towards the terminal resistors, is just compensated in its effect on the characteristic impedance or partial characteristic impedance.

6. The device as claimed in claim 1, wherein the TEM waveguide (1) exhibits a removable feed wedge (1.2), the longitudinal extent of which corresponds approximately to one tenth of the total length of the TEM waveguide (1).

7. The device as claimed in claim 6, wherein the removable feed wedge (1.2) is sealed in a gas-tight manner on all sides, in relation to the remaining part of the TEM waveguide (1), in particular by means of a dielectric foil, and is preferably constructed even to accommodate an excess pressure.

8. The device as claimed in claim 7, wherein the volume of the removable feed wedge (1.2) of the TEM waveguide (1) is filled with $SF_6$ gas, preferably under excess pressure.

9. The device as claimed in claim 1, wherein the terminal resistors (8.1, 8.2, 8.3) are constructed as high-tension resistors for at least 100 kV.

* * * * *